United States Patent
Babbush et al.

(10) Patent No.: US 12,079,686 B2
(45) Date of Patent: Sep. 3, 2024

(54) TARGETING MANY-BODY EIGENSTATES ON A QUANTUM COMPUTER

(71) Applicant: Google LLC, Mountain View, CA (US)

(72) Inventors: Ryan Babbush, Venice, CA (US); Jarrod Ryan McClean, Marina Del Rey, CA (US)

(73) Assignee: Google LLC, Mountain View, CA (US)

( * ) Notice: Subject to any disclaimer, the term of this patent is extended or adjusted under 35 U.S.C. 154(b) by 863 days.

(21) Appl. No.: 16/975,628

(22) PCT Filed: May 10, 2019

(86) PCT No.: PCT/US2019/031649
§ 371 (c)(1),
(2) Date: Aug. 25, 2020

(87) PCT Pub. No.: WO2019/217772
PCT Pub. Date: Nov. 14, 2019

(65) Prior Publication Data
US 2020/0410382 A1    Dec. 31, 2020

(51) Int. Cl.
*G06N 10/00*   (2022.01)
*H03K 19/173*  (2006.01)

(52) U.S. Cl.
CPC ........... *G06N 10/00* (2019.01); *H03K 19/173* (2013.01)

(58) Field of Classification Search
CPC ............................ G06N 10/00; H03K 19/173
See application file for complete search history.

(56) References Cited

U.S. PATENT DOCUMENTS

| 2004/0000666 A1 | 1/2004 | Lidar et al. | |
| 2015/0111754 A1* | 4/2015 | Harris | H03K 3/38 365/162 |
| 2019/0179871 A1* | 6/2019 | Granade | G06F 17/16 |

FOREIGN PATENT DOCUMENTS

| JP | 2014/216596 | 11/2014 |
| WO | WO 2004/013808 | 2/2004 |
| WO | WO 2017/116446 | 7/2017 |

(Continued)

OTHER PUBLICATIONS

Whitfield et al., Simulation of Electronic Structure Hamiltonians Using Quantum Computers, arXiv:1001.3855v3, Dec. 19, 2010, 22 pages (Year: 2010).*

(Continued)

*Primary Examiner* — Li B. Zhen
*Assistant Examiner* — William Wai Yin Kwan
(74) *Attorney, Agent, or Firm* — Fish & Richardson P.C.

(57) ABSTRACT

Methods, systems and apparatus for targeting many-body states on a quantum computer. In one aspect, a method includes an adaptive phase shift method that includes preparing the quantum system in an initial state, wherein the initial state has non-zero overlap with the target eigenstate; preparing an ancilla qubit in a zero computational basis state; and iteratively applying a quantum eigenstate locking circuit to the quantum system and ancilla qubit until the state of the quantum system approximates the target eigenstate, wherein the quantum eigenstate locking circuit comprises a phase gate that, at each n-th iteration, is updated using a current average energy estimate of the quantum system.

26 Claims, 6 Drawing Sheets

(56) References Cited

FOREIGN PATENT DOCUMENTS

| WO | WO 2017/200536 | 11/2017 |
|---|---|---|
| WO | WO 2019/217772 | 11/2019 |

OTHER PUBLICATIONS

Farhi et al., Quantum Computation by Adiabatic Evolution, arXiv:quant-ph/0001106v1, Jan. 28, 2000, 24 pages (Year: 2000).*
Hen, Itay, Fourier-transforming with quantum annealers, Frontiers in Physics vol. 2, Article 44, Jul. 28, 2014, 7 pages (Year: 2014).*
Daskin et al., A universal quantum circuit scheme for finding complex eigenvalues, Quantum Information Processing (2014) Feb. 13, 2013, pp. 333-353 (Year: 2013).*
Pezze et al., Quantum theory of phase estimation, arXiv:1411.5164v1, Nov. 19, 2014, 49 pages (Year: 2014).*
McKay et al., Efficient Z-Gates for Quantum Computing, arXiv:1612.00858v2, Jun. 28, 2017, 8 pages (Year: 2017).*
Yimsiriwattana et al., Generalized GHZ States and Distributed Quantum Computing, arXiv:quant-ph/0402148v3, Mar. 11, 2004, 16 pages (Year: 2004).*
Babbush, Ryan Joseph, Towards Viable Quantum Computation for Chemistry, Doctoral Dissertation, Harvard University, Graduate School of Arts & Sciences, May 2015, 376 pages (Year: 2015).*
EP Office Action in European Appln. No. 19725618.3, dated Aug. 18, 2022, 28 pages.
Childs et al., "Quantum search by measurement," Physical Review A.,, Sep. 2002, 66(3):032314.
McClean et al., "Eigenlocking," Google Inc., Jan. 2018, 3 pages.
PCT International Search Report and Written Opinion in International Appln. No. PCT/US2019/031649, dated Aug. 2, 2019, 19 pages.
PCT International Search Report and Written Opinion in International Appln. No. PCT/US2019/031649, dated May 20, 2020, 25 pages.
Svore et al., "Faster phase estimation," arXiv preprint arXiv:1304.0741, Apr. 1-14, 2013.
Office Action in Canadian Appln No. 3,093,134, dated Jan. 26, 2022, 2 pages.
CA Office Action in Canadian Appln. No. 3,093,134, dated Oct. 14, 2022, 4 pages.
Office Action in Canadian Appln. No. 3,093,134, mailed on Oct. 26, 2023, 6 pages.

* cited by examiner

300

```
┌─────────────────────────────────────┐
│ Prepare quantum system in an initial state │
│ that has non-zero overlap with the target  │
│            eigenstate                      │
│                              302           │
└─────────────────────────────────────┘
                  │
                  ▼
┌─────────────────────────────────────┐
│   Prepare ancilla qubit in 0 state         │
│                              304           │
└─────────────────────────────────────┘
                  │
                  ▼
┌─────────────────────────────────────┐
│  Iteratively adjust quantum system and     │
│  ancilla qubit, wherein at each n-th iteration │
│  a phase gate applied to the ancilla qubit │
│  is updated using a current average energy │
│  estimate of the quantum system            │
│                              306           │
└─────────────────────────────────────┘
```

FIG. 3

TARGETING MANY-BODY EIGENSTATES ON A QUANTUM COMPUTER

CROSS-REFERENCE TO RELATED APPLICATION

This application is a National Stage Application under 35 U.S.C. § 371 and claims the benefit of International Application No. PCT/US2019/031649, filed May 10, 2019, which claims priority to U.S. Application No. 62/670,322, filed May 11, 2018, the disclosure of which is incorporated herein by reference.

BACKGROUND

This specification relates to quantum computing.

SUMMARY

This specification describes technologies for preparing target states of quantum systems.

In general, one innovative aspect of the subject matter described in this specification can be implemented in an adaptive phase shift method for preparing a target eigenstate of a Hamiltonian characterizing a quantum system, the method comprising: the quantum system in an initial state, wherein the initial state has non-zero overlap with the target eigenstate; preparing an ancilla qubit in a zero computational basis state; and iteratively adjusting the quantum system and ancilla qubit until the state of the quantum system approximates the target eigenstate, wherein adjusting the quantum system and ancilla qubit comprises, at each n-th iteration, updating a phase gate applied to the ancilla qubit using a current average energy estimate of the quantum system.

Another innovative aspect of the subject matter described in this specification can be implemented in an apparatus comprising: a classical processor; a quantum computing device comprising: a quantum system prepared in an initial state, wherein the initial state has non-zero overlap with a target eigenstate; one or more ancilla qubits each prepared in a zero computational basis state; a plurality of control lines coupled to the quantum system and the one or more ancilla qubits; and a plurality of control circuits coupled to the plurality of control lines, the plurality of control circuits configured to iteratively apply a quantum eigenstate locking circuit to the quantum system and one or more ancilla qubits until the state of the quantum system approximates the target eigenstate, wherein the quantum eigenstate locking circuit comprises a phase gate that, at each n-th iteration, is updated by the classical processor using a current average energy estimate of the quantum system.

Other implementations of these aspect include corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations adjusting the quantum system and ancilla qubit comprises: applying a first Hadamard gate to the ancilla qubit; applying the phase gate to the ancilla qubit; controlling evolution of the quantum system under the Hamiltonian for a time t; applying a second Hadamard gate to the ancilla qubit; and measuring the ancilla qubit.

In some implementations the phase gate is given by $|0\rangle\langle 0| + ie^{i\gamma}|1\rangle\langle 1|$ wherein $|0\rangle$ represents the zero computational basis state, $|1\rangle$ represents the one computational basis state and $\gamma$ represents the phase shift.

In some implementations controlling evolution of the quantum system under the Hamiltonian for a time t comprises modifying evolution of the quantum system under the Hamiltonian by a shift $\gamma$.

In some implementations updating the phase gate using a current average energy estimate of the quantum system comprises, for each iteration: estimating the average energy of the quantum system using i) an ancilla measurement result, ii) phase shift, and iii) time t for the previous iteration; and setting the phase shift for the current iteration equal to the estimated average energy of the quantum system multiplied by the time t.

In some implementations updating the phase gate using a current average energy estimate of the quantum system comprises, for each batch of n>1 iterations: determining an average ancilla measurement result over each ancilla measurement result in the batch of iterations, wherein each ancilla measurement result in the batch of iterations corresponds to a same phase shift; estimating the average energy of the quantum system using i) the determined average ancilla measurement result, ii) the same phase shift, and iii) time t for the previous batch of iterations; and setting the phase shift for the next batch of iterations as being equal to the estimated average energy of the quantum system multiplied by the time t.

In some implementations estimating the average energy of the quantum system using i) an ancilla measurement result or average ancilla measurement result, ii) phase shift, and iii) time t for the previous iteration comprises: solving for the average energy of the quantum system using an expression representing the probability of measuring the ancilla qubit in a zero or one computational basis state.

In some implementations the Hamiltonian characterizing the quantum system comprises a final Hamiltonian, and wherein the method further comprises performing evolution of a time-dependent Hamiltonian from an initial time to a final time in steps dt, wherein at each step of the evolution the adaptive phase shift method is performed, comprising: preparing the quantum system in an initial state corresponding to an initial Hamiltonian whose target eigenstate is easy to prepare; setting the phase shift equal to an eigenenergy of an eigenstate of the initial Hamiltonian multiplied by the time t; for each time step of the evolution: updating a time-dependent Hamiltonian defined as a combination of the initial Hamiltonian and the final Hamiltonian, wherein at the initial time the time-dependent Hamiltonian is equal to the initial Hamiltonian and at the final time the time-dependent Hamiltonian is equal to the final Hamiltonian; performing the adaptive phase shift method using the updated time-dependent Hamiltonian to obtain a phase shift for a next iteration, wherein at the final step of the evolution, the obtained phase shift stores the value of the eigenenergy corresponding to the target eigenstate multiplied by the time step t.

In some implementations the evolution comprises adiabatic evolution.

In some implementations controlling evolution of the quantum system under the Hamiltonian for a time t comprises applying a circuit $|1\rangle\langle 1|\otimes U_{linear}+|0\rangle\langle 0|\otimes \mathbb{I}^{\otimes N}$ to the ancilla qubit and the quantum system, wherein $U_{linear}$ represents a linear simulation primitive operation that can be expressed as a circuit on a linear array of qubits.

In some implementations applying the circuit to the ancilla qubit and the quantum system comprises: selecting a first line of control qubits and a second line of register qubits from a planar array of qubits; initializing the first line in a GHZ state.

In some implementations the method further comprises controlling each simulation primitive operation on a qubit in the second line on a physical qubit directly above the qubit in the second line.

In some implementations the method further comprises performing quantum control techniques to directly realize the simulation primitive at the level of microwave pulses.

In some implementations the planar array of qubits further comprises a third line of ancilla qubits below the second line of register qubits, and wherein controlling each simulation primitive comprises switching between the first line and the third line for control.

In some implementations applying the circuit to the ancilla qubit and the quantum system comprises: selecting a first line of control qubits and a second line of register qubits from a planar array of qubits; controlling each simulation primitive operation on an unentangled ancilla qubit in a plus state; and measuring the ancilla qubit.

In some implementations applying the circuit to the ancilla qubit and the quantum system comprises: selecting a first line of control qubits and a second line of register qubits from a planar array of qubits; initializing groups of qubits in the first line in respective GHZ states; controlling each simulation primitive operation on a respective GHZ state; and measuring the ancilla qubit.

The subject matter described in this specification can be implemented in particular ways so as to realize one or more of the following advantages.

A system preparing target states of quantum systems (e.g. for use in a quantum computer) using the adaptive phase shift techniques described in this specification increases the probability of locking into a target state, thus increasing the rate at which the target state can be prepared compared to other systems, e.g., those that select a phase shift that minimizes the energy of resulting states.

In addition, the adaptive phase shift techniques can decrease the impact of noise on the stabilization of the target state, i.e., the adaptive phase shift technique increases the rate of convergence of the state to the target eigenstate and suppresses transitions to other states—a result of this is that noise induced transitions to undesired eigenstates are reduced.

In addition, the adaptive phase shift techniques described in this specification can be applied to settings where an initial state of the quantum system that has sufficient overlap with the target state is easy to prepare (i.e., an efficient circuit for preparing the initial state exists) and extended to settings where an initial state of the quantum system that has sufficient overlap with the target state is difficult to prepare (i.e., an efficient circuit for preparing an initial state with the desired overlap is not known.) In cases where the initial state of the quantum system is difficult to prepare, this provides a significant improvement since strategies other than those described herein can produce a low probability of locking in on the target state, or can only increase the probability of locking into some state, not the target state.

The adaptive phase shift techniques described in this specification can be implemented with significantly lower quantum circuit depth compared to other techniques, providing the possibility to implement such techniques on near term quantum computing devices, e.g., those with planar qubit architectures where Trotter steps (or other simulation primitives) can be implemented on a linear array of qubits. Such devices have a wide range of practical applications such as simulations of chemistry and materials science. In addition, in some cases these low depth techniques can enable measurements to be taken more quickly, increasing robustness against errors.

In addition, the techniques described in this specification can be characterized as weak measurement techniques—a technique where a series of weak measurements is performed on the system which extract entropy and eventually drive the system register to an eigenstate. Each time the ancilla qubit is measured a weak measurement is made in the eigenbasis of the Hamiltonian. The strength of the weak measurement is proportional to the time of the evolution that is controlled. This stabilizes the system register from drifting away from eigenstates because it is constantly weakly projected back to the eigenbasis.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 3 is a flow diagram of an example adaptive phase shift process for preparing a target eigenstate of a Hamiltonian characterizing a quantum system.

Like reference numbers and designations in the various drawings indicate like elements.

DETAILED DESCRIPTION

Overview

Preparing target states of quantum systems, in particular target states of many-body quantum systems, has a variety of practical applications such as solving hard optimization problems where the solution to such an optimization problem is encoded in a target state of a quantum system, or using quantum simulation to determine properties of quantum systems, e.g., as part of a process for designing drugs or materials. However, finding suitable and efficient methods to prepare a target quantum state is extremely difficult.

Eigenlocking (also referred to herein as eigenstate locking) is a process for obtaining a target eigenstate (and determining the corresponding eigenvalue) of a quantum system that is initially prepared in an initial state that has non-zero overlap with the target state. Eigenlocking uses one or more ancilla qubits to control stepwise time-evolution of the quantum system to steer the state of the quantum system towards the target eigenstate. During the eigenlocking process, the ancilla qubits are subject to specific unitary and non-unitary transformations including single qubit phase gates and reset or active feedback based on measurement.

This specification describes systems and methods for performing improved eigenlocking processes. One process described in this specification includes an adaptive phase shift scheme, where during the eigenlocking process phase gate parameters are iteratively updated to increase the probability of measuring the quantum system in the target quantum state. Another process described in this specification includes an adiabatic dynamic locking scheme that enables preparation of a target eigenstate even when it is hard or unfeasible to prepare an initial state with sufficient overlap with the target state. Other processes described in this specification include efficient physical implementations utilizing additional ancilla qubits that provide practical results on near term quantum computing devices.

Example Hardware

Figure 1:
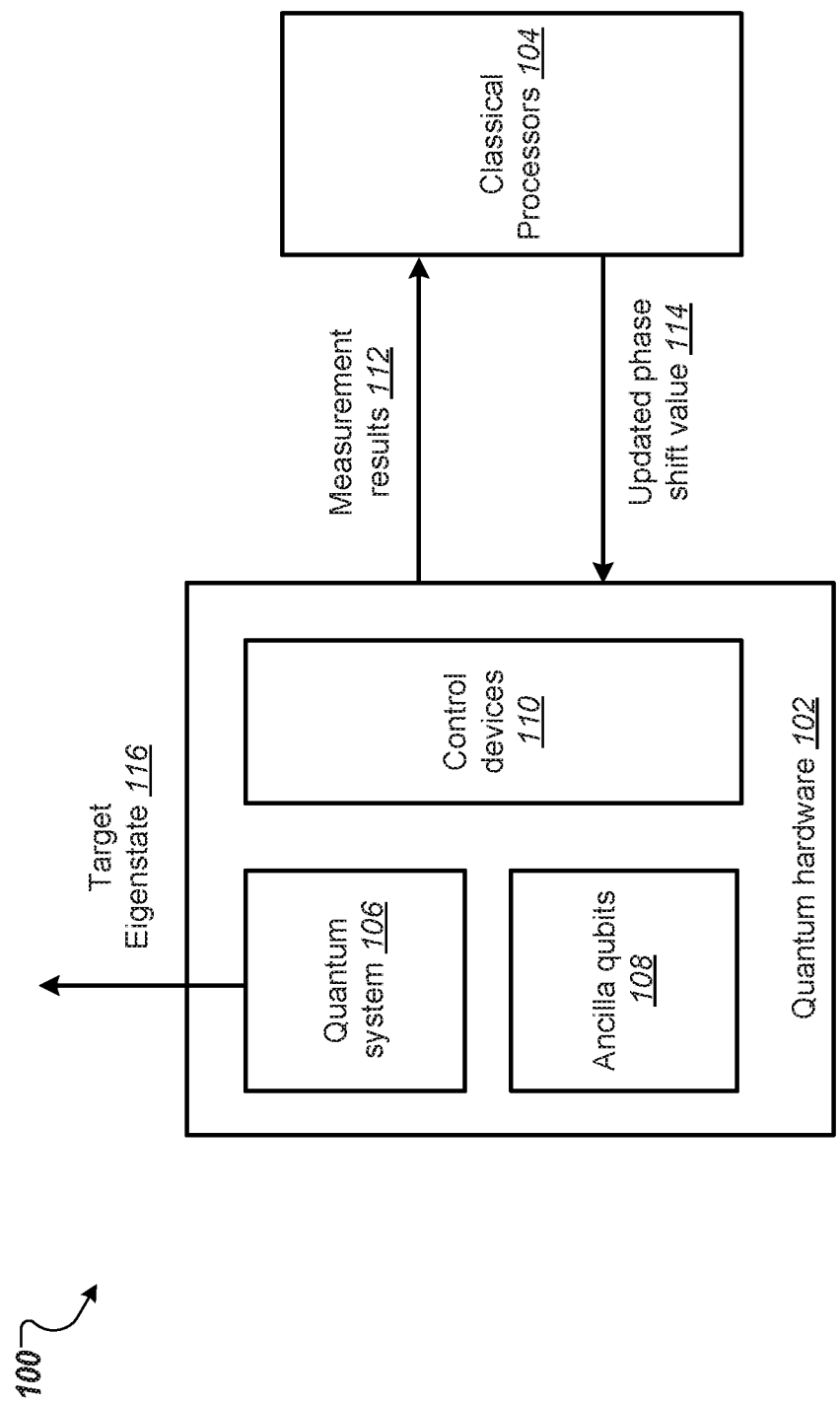
FIG. 1 depicts an example system for preparing a quantum system in a target eigenstate of a Hamiltonian characterizing the quantum system.

FIG. 1 depicts an example system 100 for preparing a quantum system in a target eigenstate of a Hamiltonian characterizing the quantum system. The example system 100 is an example of a system implemented as classical or quantum computer programs on one or more classical computers or quantum computing devices in one or more locations, in which the systems, components, and techniques described below can be implemented.

The system 100 includes quantum hardware 102 in data communication with classical processor 104. The system 100 is configured to perform classical computations in combination with quantum computations using the classical processors 104 and the quantum hardware 102.

The quantum hardware 102 includes a quantum system 106, ancilla qubits 108, and one or more control devices 110. The quantum system 106 includes a system of interacting qubits that is to be prepared in the target state. The system of interacting qubits may include qubits that can be efficiently prepared in an initial state and operated on via application of a quantum circuit. The type of physical realizations of qubits included in the quantum system may vary. For example, in some implementations the quantum system 106 may include superconducting qubits, e.g., superconducting charge qubits, superconducting flux qubits or superconducting phase qubits. In other implementations the quantum system 106 may include qubits realized by spins, e.g., electron spins, nuclear spins or atomic spins.

The ancilla qubits 108 may also include interacting qubits that can be efficiently prepared in an initial state and operated on via application of a quantum circuit. The type of physical realizations of the ancilla qubits 108 may vary. For example, in some implementations the ancilla qubits 108 may include superconducting qubits, e.g., superconducting charge qubits, superconducting flux qubits or superconducting phase qubits. In other implementations the ancilla qubits 108 may include qubits realized by spins, e.g., electron spins, nuclear spins or atomic spins.

The ancilla qubits 108 may interact with the quantum system 106. For example, the ancilla qubits 108 and the qubits included in the quantum system 106 may be arranged as a planar array, as described below with reference to FIGS. 5 and 6.

The control devices 110 include devices configured to operate on the quantum system 106 and on the ancilla qubits 108. For example, the control devices 110 may include hardware for applying a quantum circuit of quantum logic gates to the quantum system 106 and ancilla qubits 108, e.g., control lines coupled to the quantum system and ancilla qubits and control circuits coupled to the plurality of control lines for application of quantum circuits. In addition, the control devices 110 may include hardware for performing measurements on the quantum system 106 and the ancilla qubits 108, e.g., oscillators. In some implementations the control devices may include microwave control devices.

To prepare the quantum system 106 in a target eigenstate of a Hamiltonian characterizing a quantum system 106, the system 100 is configured to prepare the quantum system 106 in an initial state that has non-zero overlap with the target eigenstate, e.g., using the one or more control devices 110. The system 100 is further configured to prepare the ancilla qubits 108 in an initial state, e.g., each ancilla qubit in the zero computational basis state. The system 100 may then cause the control devices 110 to iteratively apply a quantum eigenstate locking circuit to the quantum system 106 and one or more ancilla qubits 108 until the state of the quantum system 106 approximates the target eigenstate. An example quantum eigenstate locking circuit is described in detail below with reference to FIG. 2.

As described below with reference to FIG. 2, the quantum eigenstate locking circuit includes a phase gate that, at each n-th iteration, is updated by the classical processor using a current average energy estimate of the quantum system. For example, as described in more detail below with reference to FIGS. 2 and 3, after each application of the quantum eigenstate locking circuit the system 100 may cause the one or more control devices 110 to measure the ancilla qubit and provide the measurement result 112 to the classical processors 104. The classical processors 104 may use the measurement result 112 to estimate an average energy of the quantum system 106 using i) the ancilla measurement result (or a determined average ancilla measurement result over multiple iterations in a batch of iterations), ii) the phase shift for the previous iteration (or previous batch of iterations), and iii) the time t for the previous iteration (or previous batch of iterations). Estimating the average energy of the quantum system 106 is described in more detail below with reference to FIG. 3.

The classical processors 104 may then set the phase shift for the current iteration equal to the estimated average energy of the quantum system multiplied by the time t and provide data representing the set phase shift for the current iteration 114 to the one or more control devices 110. The one or more control devices 110 may then use the updated phase shift 114 when applying the next iteration of the quantum eigenstate locking circuit.

The quantum system 106 will reach the target eigenstate 116 after a time that depends on the energetic gap between that state and the closest eigenstate present in significant quantity in the initial state.

In some implementations the system 100 may further be configured to perform an adiabatic dynamic locking scheme to prepare the quantum system 106 in a target eigenstate of a Hamiltonian characterizing a quantum system 106, e.g., in cases where preparing the quantum system 106 in an initial state with sufficient overlap with the target eigenstate is difficult or intractable. That is, the system may be configured to perform adiabatic evolution of a time-dependent Hamiltonian from an initial time to a final time in steps dt, where at each step of the adiabatic evolution an adaptive phase shift method (as described below with reference to FIG. 3) is performed. An example adiabatic dynamic locking scheme that may be performed by the system 100 is described in more detail below with reference to FIG. 4.

In some implementations the system 100 may further be configured to perform low depth implementations of target state preparation by utilizing additional ancilla qubits. For example, the system 100 may be configured to arrange the quantum system qubits and ancilla qubits as a ladder, where a top line of qubits include ancilla (control) qubits and a bottom line of qubits below the top line include system qubits. In some cases the system 100 may cause the control devices 110 to prepare the top line of qubits in a single GHZ state or group multiple qubits in the top line into multiple respective GHZ states. The system 100 may then cause the control devices 110 to control simulation primitives on qubits in the bottom line on respective control qubits that are directly above. Alternatively, the system may cause the control devices 110 to control simulation primitives at the level of microwave pulses. Alternatively or in combination thereof, the system 100 may cause the control devices 110 to control simulation primitive operations on qubits in the bottom line on respective unentangled ancilla qubits in a plus state. Such locking schemes are described in more detail below with reference to FIGS. 5 and 6.

Figure 2:
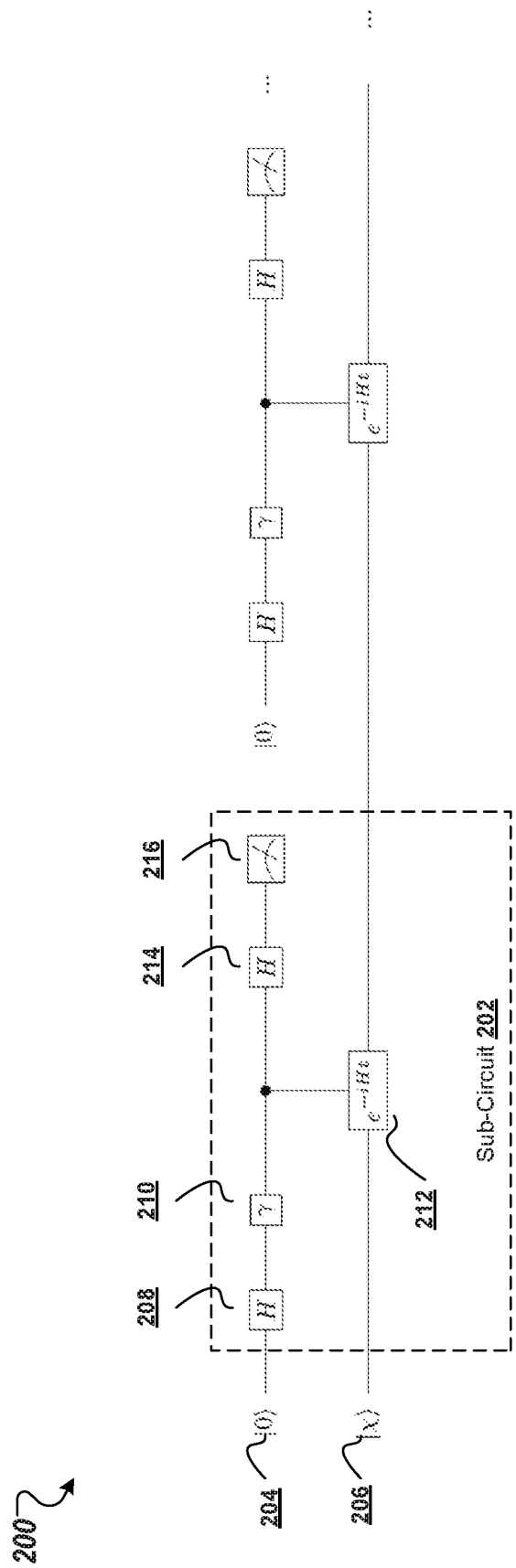
FIG. 2 is an illustration of an example application of a quantum eigenstate locking circuit.

FIG. 2 is an illustration of an example quantum eigenstate locking circuit 200. As will be described in more detail below, the example quantum eigenstate locking circuit 200 includes multiple applications of a sub-circuit 202. For convenience, the example quantum eigenstate locking circuit 200 shows the sub-circuit 202 as being applied twice, however the sub-circuit 202 may be repeatedly applied until an approximate target eigenstate is obtained.

The example quantum eigenstate locking circuit 200 is applied to an ancilla qubit 204 prepared in a $|0\rangle$ state and a quantum system 206 prepared in an initial state $|\chi\rangle$. A described in more detail below with reference to FIGS. 3 and 4, the initial state of the quantum system may be easy or difficult to prepare.

The sub-circuit 202 includes a first Hadamard gate 208 that is applied to the ancilla qubit 204. The sub-circuit 202 further includes a phase gate 210 that is applied to the ancilla qubit 204 after the first Hadamard gate 208 is applied. The phase gate may be defined as $|0\rangle\langle 0|+ie^{i\gamma}|1\rangle\langle 1|$ with $\gamma$ representing the phase shift. The sub-circuit includes a controlled operation 212 that evolves the quantum system under the Hamiltonian H for a time t. The controlled operation 212 acts on both the ancilla qubit 204 and the quantum system 206, wherein the ancilla qubit 204 acts as the control. The sub-circuit 202 includes a second Hadamard gate 214 that is applied to the ancilla qubit 204 after the controlled operation 212, and a measurement operation 216 that measures the ancilla qubit after the second Hadamard gate 214 is applied.

The sub-circuit 202 may then be repeatedly applied to the ancilla qubit 204 and the quantum system 206, where at each repetition the ancilla qubit is reset and prepared in a $|0\rangle$ state and the quantum system 206 remains in an evolved state corresponding to the output of the previous sub-circuit. In this manner, the state of the quantum system 206 evolves until it approximates, to a desired precision, the target eigenstate.

Upon execution of the circuit 200 (excluding a final measurement of the ancilla 204), the state of the quantum system 206 is given by Equation (1) below.

$$\frac{1}{\sqrt{2}}[(1 - ie^{i\gamma}e^{-iHt})|\chi\rangle|0\rangle + (1 + ie^{i\gamma}e^{-iHt})|\chi\rangle|1\rangle] \quad (1)$$

Expanding Equation (1) into the eigenstate basis gives Equation (2) below.

$$\frac{1}{\sqrt{2}}\left[\sum_i c_i(1 - ie^{-i(E_i t - \gamma)})|\psi_i\rangle|0\rangle + \sum_i c_i(1 + ie^{-i(E_i t - \gamma)})|\psi_i\rangle|1\rangle\right] \quad (2)$$

As can be seen from Equation (2), evolving the quantum system under the Hamiltonian for a time t includes modifying the evolution of the quantum system under the Hamiltonian H by a shift $\gamma$.

Upon measuring the ancilla 204, the magnitude of the eigenstate coefficients are proportional to $$|c_i|^2(1-\sin\phi_i) \text{ if } 0$$

$$|c_i|^2(1+\sin\phi_i) \text{ if } 1$$

where $\phi_i = (E_i t - \gamma)$. Choosing $$\phi_i \in \left[-\frac{\pi}{2}, \frac{\pi}{2}\right),$$

which is possible through a specific choice of $\gamma$ and t, upon measuring a 0, eigenstates with energies $E_i t - \gamma < 0$ increase in magnitude while energies $E_i t - \gamma > 0$ decrease in magnitude. If a 1 is measured, the reverse is true. This can be interpreted as resulting in "cooling" the quantum system for 0 measurements, and "heating" the quantum system for 1 measurements in the basis of H.

Continuing this analysis, the probability of measurement at any given point in the algorithm is given by Equation (3) below.

$$Pr(0) = \frac{1}{2}\sum_i |c_i|^2(1 - \sin\phi_i) \quad (3)$$

$$Pr(1) = \frac{1}{2}\sum_i |c_i|^2(1 + \sin\phi_i)$$

If t and $\gamma$ are chosen such that the set of $\phi_i$ are relatively small, then these expressions may be approximated by the expressions given below in Equation (4).

$$Pr(0) \approx \frac{1}{2}\sum_i |c_i|^2(1 - E_i t + \gamma) = \frac{1}{2}\left[1 - \sum_i |c_i|^2(E_i t - \gamma)\right] \quad (4)$$

$$Pr(1) \approx \frac{1}{2}\sum_i |c_i|^2(1 + E_i t - \gamma) = \frac{1}{2}\left[1 + \sum_i |c_i|^2(E_i t + \gamma)\right]$$

Equation (4) represents a shift determined like an energy weighted average based on an offset. If the set of values above $\gamma$ dominate in the spectral decomposition a 1 is more likely and vice versa.

Programming the Hardware—Adaptive Phase Shift

FIG. 3 is a flow diagram of an example adaptive phase shift process 300 for preparing a target eigenstate $|\psi_0\rangle$ of a Hamiltonian characterizing a quantum system. For convenience, the process 300 will be described as being performed by a system of one or more classical or quantum computing devices located in one or more locations. For example, a quantum computation system, e.g., the system 100 of FIG.

1, appropriately programmed in accordance with this specification, can perform the process 300.

The system prepares the quantum system in an initial state (step 302). The initial state may be given by Equation (5) below.

$$|\chi\rangle = c_0|\psi_0\rangle + \sum_{i=1}^{n} c_i|\psi_i\rangle \quad (5)$$

In Equation (5), $|\langle\chi|\psi_0\rangle|^2 = |c_0|^2 > 0$ and $\sum_{i=1}^{n}|c_i|^2 = (1-p) < 1$. That is, the initial state has non-zero overlap with the target eigenstate. In some cases the initial state $|\chi\rangle$ may be "easy" to prepare, that is an efficient circuit for preparing the initial state may exist. In other cases it may be "difficult" to prepare the initial state $|\chi\rangle$. The latter case is described in more detail below with reference to FIG. 4.

The system prepares an ancilla qubit in a zero computational basis state $|0\rangle$ (step 304).

The system iteratively adjusts the quantum system and ancilla qubit until the state of the quantum system approximates the target eigenstate (step 306). For example, the system may iteratively apply the quantum eigenstate locking circuit 200 described above with reference to FIG. 2 to the quantum system and the ancilla qubit to adjust the quantum system and ancilla qubit.

At each n-th iteration, the system updates the phase gate, e.g., phase gate 210, included in the quantum eigenstate locking circuit using a current average energy estimate of the quantum system. Updating the phase gate using the below described techniques increases the probability of locking into the target eigenstate and decreases the impact of noise on the stabilization of the target eigenstate.

For example, in some implementations n=1 and the system may update the phase gate included in the quantum eigenstate locking circuit at each iteration. This may include first estimating the average energy of the quantum system $\langle E \rangle$ using i) an ancilla measurement result for a previous iteration, ii) a phase shift $\gamma$ for the phase gate for the previous iteration, and iii) the evolution time t for the previous iteration. For example, the system may use said values to solve for the average energy of the quantum system using an expression representing the probability of measuring the ancilla qubit in a zero or one computational basis state, e.g., as given above in Equations (3) and (4). The system may then set the phase shift of the phase gate for a current iteration equal to the estimated average energy of the quantum system multiplied by the time t for the current iteration, i.e., $\gamma = \langle E \rangle t$.

As another example, in some implementations n>1 and the system may update the phase gate included in the quantum eigenstate locking circuit after each batch of n>1 iterations. This may include determining an average ancilla measurement result over each ancilla measurement result in the batch of iterations (where each ancilla measurement result in the batch of iterations corresponds to a same phase shift/phase gate). The system may then estimate the average energy of the quantum system $\langle E \rangle$ using i) the determined average ancilla measurement result, ii) the phase shift $\gamma$ for the phase gate applied in the batch of iterations, and iii) the evolution time t used in the batch of iterations. For example, the system may use said values to solve for the average energy of the quantum system using an expression representing the probability of measuring the ancilla qubit in a zero or one computational basis state, e.g., as given above in Equations (3) and (4). The system may then set the phase shift of the phase gate for the next batch of iterations equal to the estimated average energy of the quantum system multiplied by the time t for the current iteration, i.e., $\gamma = \langle E \rangle t$.

Programming the Hardware—Moving Target Lock

Figure 4:
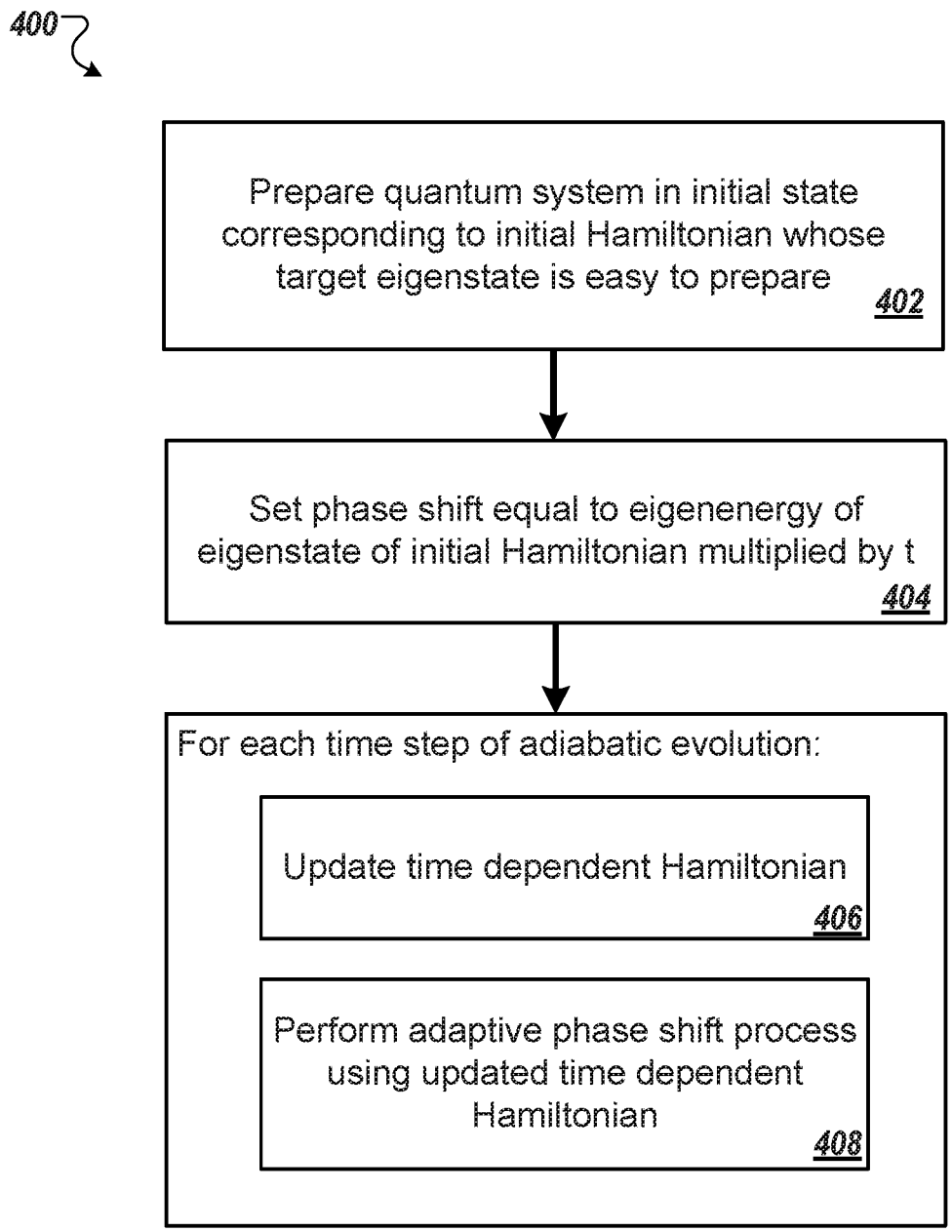
FIG. 4 is a flow diagram of an example moving target lock process for preparing a target eigenstate of a Hamiltonian characterizing a quantum system.

FIG. 4 is a flow diagram of an example moving target lock process 400 for preparing a target eigenstate $|\psi_0\rangle$ of a Hamiltonian characterizing a quantum system. For convenience, the process 400 will be descried as being performed by a system of one or more classical or quantum computing devices located in one or more locations. For example, a quantum computation system, e.g., the system 100 of FIG. 1, appropriately programmed in accordance with this specification, can perform the process 400.

The example moving target lock process 400 uses the adaptive phase shift process 300 described above with reference to FIG. 3 as a sub-routine. As described with reference to FIG. 3, in some cases the initial state $|\chi\rangle$ given in Equation (5) above may be "difficult" to prepare, that is an efficient circuit for preparing an initial state with sufficient overlap with the target eigenstate may not exist. In such a case, the probability of locking in on the desired state may be reduced, and the proposed strategy of adaptive phase shift may only offer an advantage in locking into some state, not the target one.

The present invention circumvents this by using a time-dependent Hamiltonian that follows an adiabatic path from an initial time to a final time in steps dt, wherein at each step of the evolution, e.g., adiabatic evolution, the adaptive phase shift process 300 is performed. More specifically, the process 400 proceeds as follows.

The system prepares the quantum system in an initial state corresponding to an initial Hamiltonian $H_i$ whose target eigenstate is easy to prepare (step 402).

The system sets the phase shift of the phase gate that will be applied as part of the adaptive phase shift process 300 equal to an eigenenergy of an eigenstate of the initial Hamiltonian multiplied by the time t (step 404).

For each time step of the adiabatic evolution, the system updates a time-dependent Hamiltonian defined as a combination of the initial Hamiltonian and the final Hamiltonian, wherein at the initial time the time-dependent Hamiltonian is equal to the initial Hamiltonian and at the final time the time-dependent Hamiltonian is equal to the final Hamiltonian (step 406). That is, the system defines a time dependent Hamiltonian $$H(\tau) = (1-\tau)H_i + \tau H_f$$

where $0 \leq \tau \leq 1$ and $H_f$ represents the final Hamiltonian, i.e., the Hamiltonian characterizing the quantum system with an eigenstate that is the target state.

For each time step of the adiabatic evolution, the system performs the adaptive phase shift process 300 using the updated time-dependent Hamiltonian to obtain a phase shift for a next iteration (step 408).

At the final step of the adiabatic evolution, i.e., when $H = H(\tau=1) = H_f$, the obtained phase shift stores the value of the eigenenergy corresponding to the target eigenstate multiplied by the time step t.

Programming the Hardware—Low Depth Eigenlocking

Figure 5:
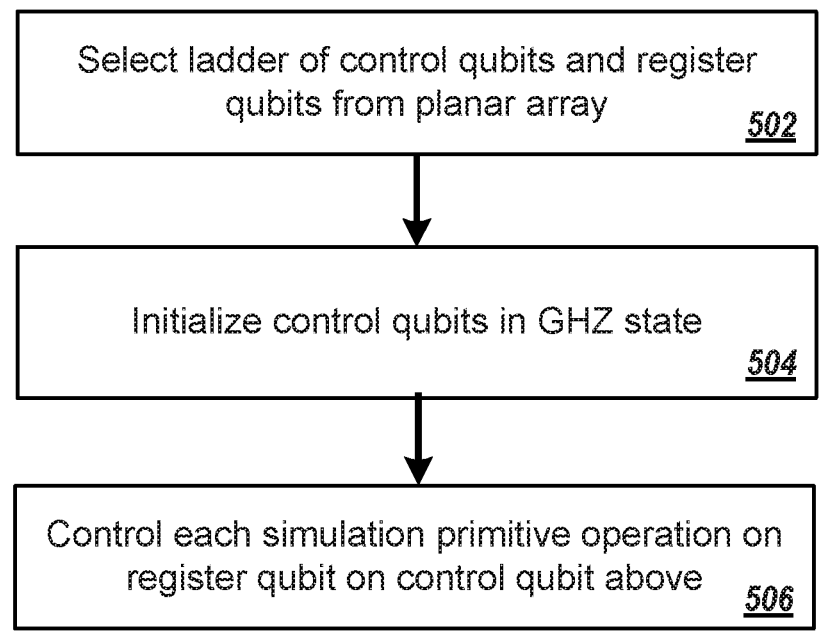
FIG. 5 is a flow diagram of an example low depth process for applying a quantum eigenstate locking circuit to the quantum system and ancilla qubit.

FIG. 5 is a flow diagram of an example low depth process 500 for applying a quantum eigenstate locking circuit to the quantum system and ancilla qubit. For convenience, the process 500 will be described as being performed by a system of one or more classical or quantum computing devices located in one or more locations. For example, a quantum computation system, e.g., the system 100 of FIG.

1, appropriately programmed in accordance with this specification, can perform the process 500.

In general, it is difficult to perform controlled operations, e.g., controlled operation 212 of FIG. 2, on restricted connectivity architectures, even if the unitary to be controlled is suitable for that architecture. For instance, suppose that a simulation primitive $U_{linear}$, e.g. a Trotter step, can be expressed as a circuit on a linear array, i.e.

$$U_{linear} = \prod_{l=0}^{L-1} \prod_{j=0}^{N-2} U_{j,j+1}^{(l)}$$

where $U_{i,j}^{(l)}$ represents a two-qubit gate which occurs in the $l^{th}$ cycle (layer) of the sequence of unitary transformations (the "algorithm") between qubit i and qubit j. Since i=j−1 in this example above, this circuit may be naturally implemented on a linear array. Now suppose the controlled-$U_{linear}$ operation which controls the application of $U_{linear}$ is to be implemented on an ancilla. If the control is a single qubit then this is impossible on a planar array with O(N) SWAP gates because one ancilla qubit cannot be adjacent to all N system qubits.

Therefore, applying a circuit such as $|1\rangle\langle 1|\otimes U_{linear}+|0\rangle\langle 0|\otimes \mathbb{I}^{\otimes N}$ to the state $|+\rangle|\psi\rangle$ as required by the quantum eigenstate locking circuit, appears challenging. The present invention provides a solution to this technical problem in the form of the low depth process 500 for applying a quantum eigenstate locking circuit to the quantum system and ancilla qubit. To apply a quantum eigenstate locking circuit to a quantum system and an ancilla qubit, the process 500 proceeds as follows.

The system selects a first line of control qubits and a second line of register qubits (i.e., a "ladder") from a planar grid (step 502).

The system initializes the first line of control qubits in a Greenberger-Horne-Zeilinger (GHZ) state $|0\rangle^{\otimes N}+|1\rangle^{\otimes N}$ (step 504). The GHZ state can be thought of as "one big qubit", which can be used for control. Thus, each operation in the simulation primitive is controlled on the physical qubit directly above it.

The system controls each simulation primitive operation on a qubit in the second line on a physical qubit directly above the qubit in the second line (step 506). If each physical qubit in the control line is indexed with prime indices (so that i represents a qubit in the system register and i' represents a qubit in the control) then the controlled operation $U_{linear}$ can be expressed as $$(|1\rangle\langle 1| \otimes U_{linear} + |0\rangle\langle 0| \otimes \mathbb{I}^{\otimes N})|+\rangle|\psi\rangle \rightarrow$$

$$\prod_{l=0}^{L-1} \prod_{j=0}^{N-2} (\mathbb{I}^{\otimes(j-1)} \otimes |1\rangle\langle 1|_{j'} \otimes \mathbb{I}^{\otimes(N-j-2)} \otimes U_{j,j+1} +$$

$$\mathbb{I}^{\otimes(j-1)} \otimes |0\rangle\langle 0|_{j'} \otimes \mathbb{I}^{\otimes(2N-j-2)})(|0\rangle^{\otimes N} + |1\rangle^{\otimes N}) \otimes |\psi\rangle.$$

Therefore, the algorithm now corresponds to a number of 3-qubit gates that are geometrically local, always involving the original 2-qubit gate, controlled on a physical qubit (part of the GHZ state) directly above it. These 3-qubit gates can be implemented by controlling the rotations in $U_{linear}$ on the physical qubit directly above it. Alternatively, the system may perform quantum control techniques to directly realize the simulation primitive at the level of microwave pulses.

In some implementations the system may include an additional row of N ancilla qubits below the system register on the planar grid. Controlling each simulation primitive may then include switching between the first line and the third line for control. Since it can take a significant time to reset all the ancilla qubits and then prepare the GHZ state (preparing the GHZ state takes time O(N)), if the ancilla qubits can be reset and the GHZ state prepared in the bottom ancilla row during when the ancilla in the top row is used for control, then the bottom row will be ready for use as soon as the top row is measured.

Programming the Hardware—Trotterized Eigenlocking

Figure 6:
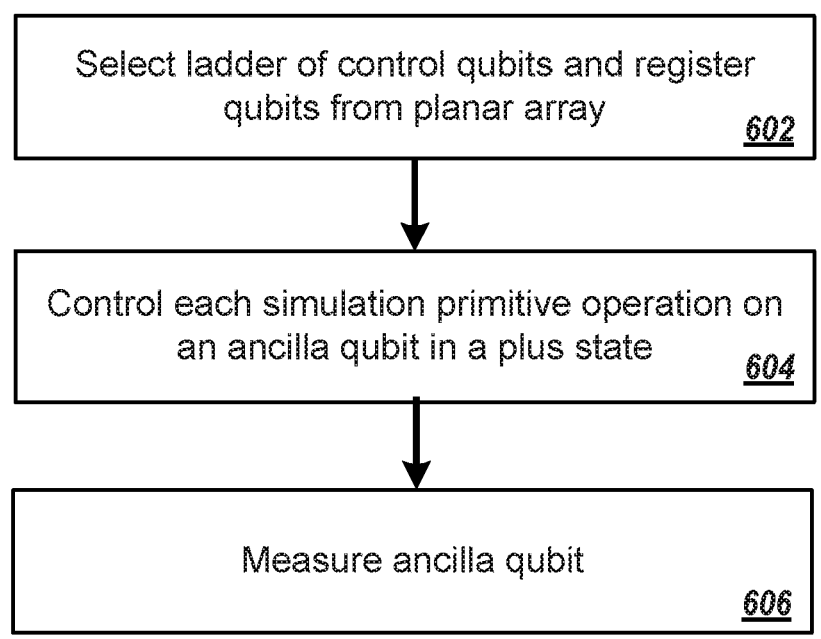
FIG. 6 is a flow diagram of an example Trotterized eigenlocking process for applying a quantum eigenstate locking circuit to the quantum system and ancilla qubit.

FIG. 6 is a flow diagram of an example Trotterized eigenlocking process 600 for applying a quantum eigenstate locking circuit to the quantum system and ancilla qubit. For convenience, the process 600 will be described as being performed by a system of one or more classical or quantum computing devices located in one or more locations. For example, a quantum computation system, e.g., the system 100 of FIG. 1, appropriately programmed in accordance with this specification, can perform the process 600.

As described above with reference to FIG. 5, applying a circuit such as $|1\rangle\langle 1|\otimes U_{linear}+|0\rangle\langle 0|\otimes \mathbb{I}^{\otimes N}$ to the state $|+\rangle|\psi\rangle$, as required by the quantum eigenstate locking circuit 200 described with reference to FIGS. 2 and 3, can be challenging. The present invention provides a second solution to this technical problem in the form of the Trotterized eigenlocking process 600 for applying a quantum eigenstate locking circuit to the quantum system and ancilla qubit.

The Trotterized eigenlocking process 600 is based on the concept of Trotterized Hamiltonian evolution—if the Hamiltonian H under which a quantum system is to be evolved can be expressed as a sum of K local terms that are easy to simulate, i.e., $H=\Sigma_k^{K-1} H_k$, then a Trotterized evolution under H would make an approximation such as $$e^{-iHt} \approx \left( \prod_{k=0}^{K-1} e^{-\frac{iH_k t}{r}} \right)^r.$$

This approximation is accurate for large r. The error in Trotterization can be computed b recursively applying the Baker-Campbell-Hausdorff expansion to the Trotterized unitary $$\left( \prod_{k=0}^{K-1} e^{-\frac{iH_k t}{r}} \right)^r.$$

Then, it may be seen that the error depends on the magnitude of the commutators between the $H_k$ t/r. The magnitude of these commutators goes to zero as r becomes large.

To apply a quantum eigenstate locking circuit to a quantum system and an ancilla qubit, the process 600 uses a circuit construction similar to that described above with reference to FIG. 5. However, instead of controlling on a GHZ state (as in step 506 of FIG. 5), each term is controlled on an unentangled ancilla in the $|+\rangle$ and then measured.

More specifically, the system selects a first line of control qubits and a second line of register qubits from a planar array of qubits (step 602). This first step is similar to step 502 described with reference to FIG. 5.

The system controls each simulation primitive operation $$e^{-\frac{iH_k t}{r}}$$

on an unentangled ancilla qubit in a plus state (step 604).

The system measures the ancilla qubit (step 606). For large enough r, these measurements will commute. The size of r can therefore be thought of as determining how "strong" a measurement is being performed when the ancilla is measured. For large r, this procedure may be equivalent to eigenlocking on the entire Hamiltonian H. By controlling each term in the Hamiltonian on an ancilla, the rate of measurement (and thus the rate of entropy extraction) may be significantly higher, e.g., when compared to other processes such as processes 300-500.

As described above with reference to FIG. 5, in some implementations the system may include an additional row of N ancilla qubits below the system register on the planar grid. Controlling each simulation primitive may then include switching between the first line and the third line for control. For example, in the case of performing linearized electronic structure simulation, each 2-qubit "fermionic simulation gate" corresponds to the simulation of a different term. A different ancilla can then be assigned for each term simulated in a single layer of gates. The system may then switch to the ancilla below the simulation register in the next layer, when the previous ancilla are being refreshed.

In some implementations the processes 500 and 600 may be combined. For example, instead of initializing the entire first line of control qubits in a GHZ state at step 504 of process 500, or instead of having a different qubit for each term at step 604 of process 600, the system may initialize groups of qubits in the first line in respective GHZ states and control each simulation primitive operation on a respective GHZ state, e.g., control several terms on a small GHZ state prior to measurement. How the process 500 and 600 are combined, e.g., the size of the GHZ states initialized by the system, may vary from application to application, and may depend on properties of the apparatus implementing the process, e.g., gate fidelity, measurement error rate, and particular details of the simulated system.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. An adaptive phase shift method for preparing a target eigenstate of a Hamiltonian characterizing a quantum system, the method comprising:

preparing the quantum system in an initial state, wherein the initial state has non-zero overlap with the target eigenstate;

preparing an ancilla qubit in a zero computational basis state; and iteratively adjusting the quantum system and ancilla qubit until the state of the quantum system approximates the target eigenstate to within a target precision, wherein adjusting the quantum system and ancilla qubit comprises, at each batch of n-th iterations:

for each iteration in the batch:

preparing the ancilla qubit in the zero computational basis state;

applying a first Hadamard gate to the ancilla qubit;

applying a phase gate to the ancilla qubit, the phase gate applying a phase shift between the zero computational basis state and a one computational basis state of the ancilla qubit, wherein the phase shift is the same for each iteration in the batch;

applying a controlled operation to the quantum system and ancilla qubit, the controlled operation controlling evolution of the quantum system under the Hamiltonian for a time t, wherein the ancilla qubit acts as a control;

applying a second Hadamard gate to the ancilla qubit; and measuring the ancilla qubit to determine an ancilla qubit state;

determining an estimated current average energy of the quantum system based on (i) an average of the ancilla qubit state for the batch, (ii) the time t used in the batch, and (iii) the phase shift applied by the phase gate for the batch; and updating the phase shift applied by the phase gate to the ancilla qubit for the next batch of iterations such that the updated phase shift is equal to the estimated current average energy of the quantum system multiplied by the time t.

2. The method of claim 1, wherein the phase gate is given by $|0\rangle\langle 0|+ie^{i\gamma}|1\rangle\langle 1|$ wherein $|0\rangle$ represents the zero computational basis state, $|1\rangle$ represents the one computational basis state and $\gamma$ represents the phase shift.

3. The method of claim 2, wherein controlling evolution of the quantum system under the Hamiltonian for a time t comprises modifying evolution of the quantum system under the Hamiltonian by the phase shift $\gamma$.

4. The method of claim 1, wherein determining the estimated current average energy of the quantum system comprises:

solving for the average energy of the quantum system using an expression representing the probability of measuring the ancilla qubit in a zero or one computational basis state.

5. The method of claim 1, wherein the Hamiltonian characterizing the quantum system comprises a final Hamiltonian, and wherein the method further comprises performing evolution of a time-dependent Hamiltonian from an initial time to a final time in steps dt, wherein at each step of the evolution the adaptive phase shift method is performed, comprising:

preparing the quantum system in an initial state corresponding to an initial Hamiltonian, wherein the quantum system is prepared in the initial state according to an existing circuit;

setting the phase shift equal to an eigenenergy of an eigenstate of the initial Hamiltonian multiplied by the time t;

for each time step of the evolution:

updating a time-dependent Hamiltonian defined as a combination of the initial Hamiltonian and the final Hamiltonian, wherein at the initial time the time-dependent Hamiltonian is equal to the initial Hamiltonian and at the final time the time-dependent Hamiltonian is equal to the final Hamiltonian;

performing the adaptive phase shift method using the updated time-dependent Hamiltonian to obtain a phase shift for a next iteration, wherein at the final step of the evolution, the obtained phase shift stores the value of the eigenenergy corresponding to the target eigenstate multiplied by the time step t.

6. The method of claim 5, wherein the evolution comprises adiabatic evolution.

7. The method of claim 1, wherein controlling evolution of the quantum system under the Hamiltonian for a time t comprises applying a circuit $|1\rangle\langle 1|\otimes U_{linear}+|0\rangle\langle 0|\otimes \mathbb{I}^{\otimes N}$ to the ancilla qubit and the quantum system, wherein $U_{linear}$ represents a linear simulation primitive operation that comprises one or more rotation operations and that can be expressed as a circuit on a linear array of N qubits.

8. The method of claim 7, wherein applying the circuit to the ancilla qubit and the quantum system comprises:

selecting a first line of ancilla qubits and a second line of quantum system register qubits from a planar array of qubits;

controlling each rotation operation in the simulation primitive operation on an unentangled ancilla qubit in a plus state; and measuring the ancilla qubit.

9. The method of claim 7, wherein applying the circuit to the ancilla qubit and the quantum system comprises:

selecting a first line of ancilla qubits and a second line of quantum system register qubits from a planar array of qubits;

initializing groups of qubits in the first line in respective Greenberger-Horne-Zeilinger (GHZ) states;

controlling each rotation operation in the simulation primitive operation on a respective GHZ state; and measuring the ancilla qubit.

10. The method of claim 7, wherein applying the circuit to the ancilla qubit and the quantum system comprises:

selecting a first line of ancilla qubits and a second line of quantum system register qubits from a planar array of qubits; and initializing the first line in a Greenberger-Horne-Zeilinger (GHZ) state.

11. The method of claim 10, further comprising controlling each rotation operation in the simulation primitive operation on a qubit in the second line on a physical qubit directly above the qubit in the second line.

12. The method of claim 10, further comprising performing quantum control techniques to directly realize the linear simulation primitive operation at the level of microwave pulses.

13. The method of claim 10, wherein the planar array of qubits further comprises a third line of ancilla qubits below the second line of quantum system register qubits, and wherein the method further comprises controlling each rotation operation in the simulation primitive operation by switching between the first line and the third line for control.

14. An apparatus comprising:
a classical processor;
a quantum computing device comprising:
- a quantum system prepared in an initial state, wherein the initial state has non-zero overlap with a target eigenstate;
- one or more ancilla qubits each prepared in a zero computational basis state;
- a plurality of control lines coupled to the quantum system and the one or more ancilla qubits; and
- a plurality of control circuits coupled to the plurality of control lines, the plurality of control circuits configured to iteratively apply a quantum eigenstate locking circuit to the quantum system and one or more ancilla qubits until the state of the quantum system approximates the target eigenstate, wherein iteratively applying the quantum eigenstate locking circuit to the quantum system and one or more ancilla qubits comprises, at each batch of n iterations:
  - for each iteration in the batch:
    - preparing the ancilla qubit in the zero computational basis state;
    - applying a first Hadamard gate to the ancilla qubit;
    - applying a phase gate to the ancilla qubit, the phase gate applying a phase shift between the zero computational basis state and a one computational basis state of the ancilla qubit, wherein the phase shift is the same for each iteration in the batch;
    - applying a controlled operation to the quantum system and ancilla qubit, the controlled operation controlling evolution of the quantum system under the Hamiltonian for a time t, wherein the ancilla qubit acts as a control;
    - applying a second Hadamard gate to the ancilla qubit; and
    - measuring the ancilla qubit to determine an ancilla qubit state;
  - wherein at each batch of iterations the classical processor is configured to:
    - determine an estimated current average energy of the quantum system based on (i) an average of the ancilla qubit state for the batch, (ii) the time t used in the batch, and (iii) the phase shift applied by the phase gate for the batch; and
    - updated the phase shift applied by the phase gate to the ancilla qubit for the next batch of iterations such that the updated phase shift is equal to the estimated current average energy of the quantum system multiplied by the time t.

15. The apparatus of claim 14, wherein the phase gate is given by $|0\rangle\langle 0|+ie^{i\gamma}|1\rangle\langle 1|$ wherein $|0\rangle$ represents the zero computational basis state, $|1\rangle$ represents the one computational basis state and $\gamma$ represents the phase shift.

16. The apparatus of claim 15, wherein controlling evolution of the quantum system under the Hamiltonian for a time t comprises modifying evolution of the quantum system under the Hamiltonian by the phase shift $\gamma$.

17. The apparatus of claim 14, wherein determining the estimated current average energy of the quantum system comprises:
solving for the average energy of the quantum system using an expression representing the probability of measuring the ancilla qubit in a zero or one computational basis state.

18. The apparatus of claim 14, wherein the Hamiltonian characterizing the quantum system comprises a final Hamiltonian, and wherein the one or more control devices are further configured to perform evolution of a time-dependent Hamiltonian from an initial time to a final time in steps dt, wherein at each step of the evolution an adaptive phase shift method is performed, comprising:
preparing the quantum system in an initial state corresponding to an initial Hamiltonian, wherein the quantum system is prepared in the initial state according to an existing circuit;
setting the phase shift equal to an eigenenergy of an eigenstate of the initial Hamiltonian multiplied by the time t;
for each time step of the evolution:
  updating a time-dependent Hamiltonian defined as a combination of the initial Hamiltonian and the final Hamiltonian, wherein at the initial time the time-dependent Hamiltonian is equal to the initial Hamiltonian and at the final time the time-dependent Hamiltonian is equal to the final Hamiltonian;
  performing the adaptive phase shift method using the updated time-dependent Hamiltonian to obtain a phase shift for a next iteration,
wherein at the final step of the evolution, the obtained phase shift stores the value of the eigenenergy corresponding to the target eigenstate multiplied by the time step t.

19. The apparatus of claim 18, wherein the evolution comprises adiabatic evolution.

20. The apparatus of claim 14, wherein controlling evolution of the quantum system under the Hamiltonian for a time t comprises applying a circuit $|1\rangle\langle 1|\otimes U_{linear}+|0\rangle\langle 0|\otimes \mathbb{I}^{\otimes N}$ to the ancilla qubit and the quantum system, wherein $U_{linear}$ represents a linear simulation primitive operation that comprises one or more rotation operations and that can be expressed as a circuit on a linear array of N qubits.

21. The apparatus of claim 20, wherein applying the circuit to the ancilla qubit and the quantum system comprises:
selecting a first line of ancilla qubits and a second line of quantum system register qubits from a planar array of qubits;
controlling each rotation operation in the simulation primitive operation on an unentangled ancilla qubit in a plus state; and
measuring the ancilla qubit.

22. The apparatus of claim 20, wherein applying the circuit to the ancilla qubit and the quantum system comprises:
selecting a first line of ancilla qubits and a second line of quantum system register qubits from a planar array of qubits;
initializing groups of qubits in the first line in respective Greenberger-Horne-Zeilinger (GHZ) states;
controlling each rotation operation in the simulation primitive operation on a respective GHZ state; and
measuring the ancilla qubit.

23. The apparatus of claim 20, wherein applying the circuit to the ancilla qubit and the quantum system comprises:
selecting a first line of ancilla qubits and a second line of quantum system register qubits from a planar array of qubits; and
initializing the first line in a Greenberger-Horne-Zeilinger (GHZ) state.

24. The apparatus of claim 23, wherein applying the circuit to the ancilla qubit and the quantum system further comprises controlling each rotation operation in the simulation primitive operation on a qubit in the second line on a physical qubit directly above the qubit in the second line.

25. The apparatus of claim 23, wherein applying the circuit to the ancilla qubit and the quantum system further comprises performing quantum control techniques to directly realize the linear simulation primitive operation at the level of microwave pulses.

26. The apparatus of claim 23, wherein the planar array of qubits further comprises a third line of ancilla qubits below the second line of quantum system register qubits, and wherein applying the circuit to the ancilla qubit and the quantum system further comprises controlling each rotation operation in the simulation primitive operation by switching between the first line and the third line for control.

* * * * *